United States Patent
Wang

(10) Patent No.: US 9,184,379 B1
(45) Date of Patent: Nov. 10, 2015

(54) CAPPING THIN-FILM RESISTORS TO CONTROL INTERFACE OXIDATION

(71) Applicants: Intermolecular Inc., San Jose, CA (US); Kabushiki Kaisha Toshiba, Tokyo (JP); SanDisk 3D LLC, Milpitas, CA (US)

(72) Inventor: Yun Wang, San Jose, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/335,504

(22) Filed: Jul. 18, 2014

(51) Int. Cl.
| | |
|---|---|
| *H01L 45/00* | (2006.01) |
| *H01L 21/00* | (2006.01) |
| *H01L 49/02* | (2006.01) |
| *H01L 21/70* | (2006.01) |
| *H01L 23/522* | (2006.01) |
| *H01L 27/01* | (2006.01) |
| *H01L 27/24* | (2006.01) |

(52) U.S. Cl.
CPC ............ *H01L 45/1233* (2013.01); *H01L 28/24* (2013.01); *H01L 45/1253* (2013.01); *H01L 45/145* (2013.01); *H01L 45/1641* (2013.01); *H01L 21/707* (2013.01); *H01L 23/5228* (2013.01); *H01L 27/016* (2013.01); *H01L 27/249* (2013.01); *H01L 28/20* (2013.01); *H01L 45/04* (2013.01)

(58) Field of Classification Search
CPC . H01L 21/707; H01L 23/5228; H01L 27/016; H01L 27/249; H01L 28/20; H01L 45/04
See application file for complete search history.

(56) References Cited

U.S. PATENT DOCUMENTS

| 7,449,345 | B2 | 11/2008 | Horng | |
|---|---|---|---|---|
| 8,154,003 | B2 * | 4/2012 | Lee et al. | 257/4 |
| 8,213,223 | B2 * | 7/2012 | Koh et al. | 365/163 |
| 8,679,988 | B2 * | 3/2014 | Lee et al. | 438/785 |
| 8,693,233 | B2 * | 4/2014 | Scheuerlein et al. | 365/148 |
| 8,835,890 | B2 * | 9/2014 | Hsueh et al. | 257/2 |
| 8,878,152 | B2 * | 11/2014 | Wang et al. | 257/2 |
| 8,883,557 | B1 * | 11/2014 | Hsueh et al. | 438/104 |
| 8,901,530 | B2 * | 12/2014 | Tendulkar et al. | 257/2 |
| 8,912,524 | B2 * | 12/2014 | Wang et al. | 257/4 |
| 8,963,117 | B2 * | 2/2015 | Kumar et al. | 257/4 |
| 8,981,332 | B2 * | 3/2015 | Chiang et al. | 257/4 |
| 8,995,172 | B2 * | 3/2015 | Wang et al. | 365/148 |
| 9,012,307 | B2 * | 4/2015 | Jo et al. | 438/482 |
| 2004/0084400 | A1 | 5/2004 | Costrini | |
| 2012/0267596 | A1 * | 10/2012 | Tseng et al. | 257/4 |
| 2012/0305878 | A1 * | 12/2012 | Miller et al. | 257/4 |
| 2014/0077147 | A1 * | 3/2014 | Tong et al. | 257/4 |
| 2014/0084237 | A1 * | 3/2014 | Wang et al. | 257/4 |

(Continued)

OTHER PUBLICATIONS

Alvin A. Milgram, et al.; Electrical and Structural Properties of Mixed Chromium and SiliconMonoxide Films; ; AIP Applied Physics Letter.

*Primary Examiner* — Ida M Soward

(57) ABSTRACT

A thin cap of metal alloy or metal-silicon compound is formed over a ternary oxide or ternary nitride ReRAM embedded resistor. At least one metal in the cap is the same as a metal in the embedded resistor. If the cap oxidizes slightly (e.g., incidental to a vacuum break, anneal, or subsequent treatment or deposition), the overall resistance of the memory cell is much less affected than it would be by the same amount of oxidation directly on a surface of the uncapped oxide or nitride embedded resistor.

14 Claims, 4 Drawing Sheets

(56) References Cited

U.S. PATENT DOCUMENTS

| | | | |
|---|---|---|---|
| 2014/0235029 A1* | 8/2014 | Chiang | 438/382 |
| 2014/0256111 A1* | 9/2014 | Malhotra et al. | 438/382 |
| 2015/0017780 A1* | 1/2015 | Wang et al. | 438/382 |
| 2015/0176122 A1* | 6/2015 | Hsueh et al. | 257/4 |
| 2015/0188043 A1* | 7/2015 | Wang | 257/4 |

* cited by examiner

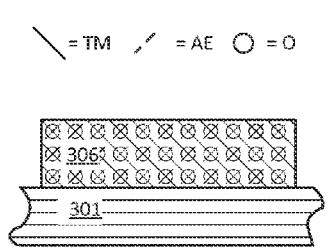
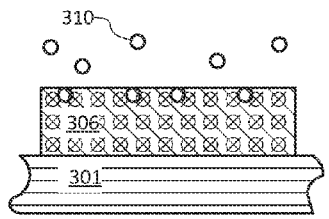
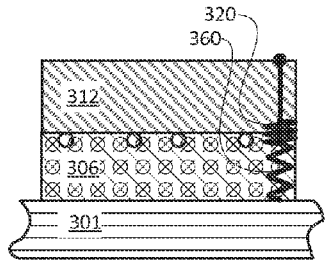
FIG. 3A    FIG. 3B    FIG. 3C
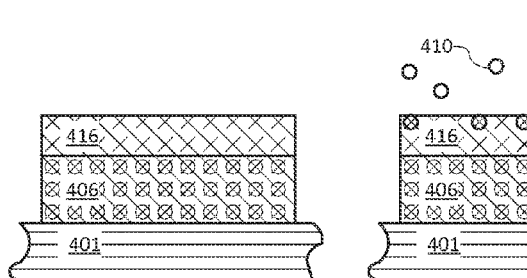
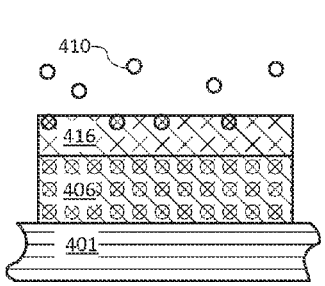
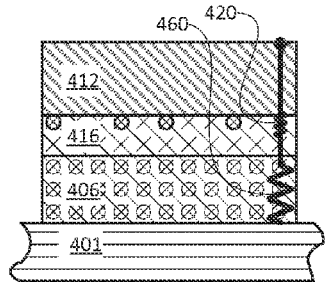
FIG. 4A    FIG. 4B    FIG. 4C
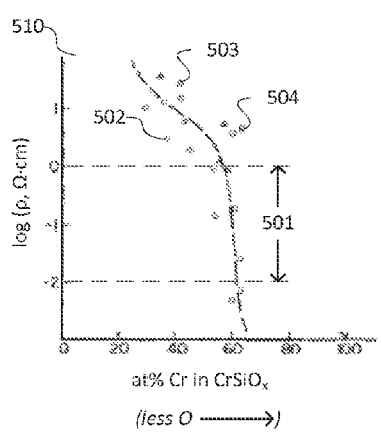
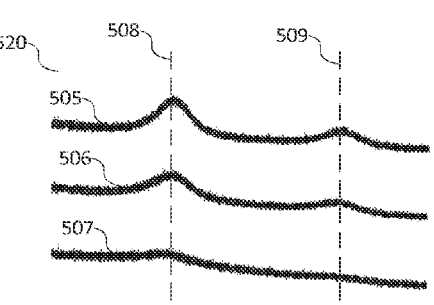
FIG. 5

US 9,184,379 B1

CAPPING THIN-FILM RESISTORS TO CONTROL INTERFACE OXIDATION

BACKGROUND

Related fields include semiconductor devices and their fabrication; in particular, thin-film components of resistive-switching non-volatile memory (ReRAM).

Nonvolatile memory elements are used in computers and other devices requiring persistent data storage (e.g., cameras, music players). Some traditional nonvolatile memory technologies (e.g., EEPROM, NAND flash) have proven difficult to scale down to smaller or higher-density configurations. Therefore, a need has developed for alternative nonvolatile memory technologies that can be scaled down successfully in terms of performance, reliability, and cost.

In resistive-switching-based nonvolatile memory, each individual cell includes a bistable variable resistor. It can be put into one of at least two states (low-resistance or high-resistance), and will stay in that state until receiving the type of input that changes it to the other state (a "write signal"). The resistive state of the variable resistor corresponds to a bit value; e.g., the low-resistance state may represent logic "1" and the high-resistance state may represent logic "0". The cell is written by applying a write signal that causes the variable resistor to change resistance. The cell is read by measuring its resistance in a way that does not change it.

Preferably, write and read operations should require as little power as possible, both to conserve energy and to avoid generating waste heat. Lowering the cells' entire range of resistance states, while keeping the different states distinguishable, can lower the required operating power.

Many ReRAM devices change resistance by creating and destroying, or lengthening and shortening, one or more conductive paths through a variable-resistance layer or stack while the bulk material remains static (e.g., it does not change phase). The bulk material is often a highly insulating dielectric. The conductive paths (also known as "percolation paths") are formed when an electric field organizes conductive or charged defects or impurities into a filament stretching from one interface to the other, with sufficient defect density that charge carriers can easily traverse the layer by tunneling from defect to defect. To return the variable resistor to the high-resistive state, it is often not necessary to destroy the entire filament, but only to introduce a gap too wide for tunneling somewhere along the filament's length. Some of the types of defects that have been used include metal clusters and oxygen (or nitrogen) vacancies.

The "forming operation" that creates the very first filament in a newly fabricated ReRAM cell is risky. The risk is of "over-forming;" creating a filament so wide or dense that the operating write signals are too weak to break it. An over-formed cell cannot be rewritten. At this point the entire device has been built, so the investment has been significant and the cost of failure is high. To prevent over-forming, resistive layers are added to the cell, functioning as resistors connected in series to limit current in the variable-resistance stack during the forming operation. The higher the added resistance during forming, the more the variable-resistance stack is protected. However, as discussed above, the higher the added resistance during normal writing, the more power is required to write the cell.

Therefore, a need exists for a practical, cost-effective way to protect the variable-resistance stack from over-forming during the forming operation, yet enable the cell to operate at low power for subsequent reading and writing.

SUMMARY

The following summary presents some concepts in a simplified form as an introduction to the detailed description that follows. It does not necessarily identify key or critical elements and is not intended to reflect a scope of invention.

To prevent interface oxidation in ternary metal oxide (or nitride) embedded resistors for ReRAM, a thin cap of the same metal and an additional element is formed over the embedded resistor. Incidental minor oxidation of the cap, unlike similar oxidation of the underlying resistor, produces no significant change in the cumulative resistance of the ReRAM stack.

Embodiments of a device may include a substrate; a first layer (a first electrode) over the substrate; a second layer (a second electrode) over the first electrode; a third layer (a variable-resistance layer) between the first electrode and the second electrode; a fourth layer (a constant-resistance layer (CRL)) between the first electrode and the second electrode; and a fifth layer (a cap layer) between and in contact with the constant-resistance layer and one of the first electrode or the second electrode.

The constant-resistance layer may include a transition metal, a first additional element, and one of oxygen or nitrogen. The transition metal may include Cr, Ta, W, or Nb. The first additional element may include Al, B, Ni, Si or Ti. A breakdown voltage of the constant-resistance layer may be less than a breakdown voltage of the variable-resistance layer. The breakdown voltage of the constant-resistance layer may be less than 3V. The resistance of the constant-resistance layer may be 0.1-1.2 M$\Omega$ before a forming operation and 1-10 K$\Omega$ after the forming operation for a device dimension of 10-50 nm. A resistivity of the constant-resistance layer may be 0.01-1 $\Omega\cdot$cm. An X-ray diffraction spectrum of the constant-resistance layer may include at least two crystalline peaks.

The cap layer may include a second additional element and the same transition metal as the constant-resistance layer. The second additional element and the first additional element may be identical or different. The second additional element may be another transition metal, such as Al, B, Ni, Si or Ti. The cap layer may also include a dopant.

In some embodiments an atomic percentage (at %) oxygen at a cap/electrode interface may be less than 5% of an at % oxygen in the constant-resistance layer. The cap layer may contact the constant-resistance layer and the second electrode.

Embodiments of a method may include forming a first layer (the first electrode) over a substrate; forming a second layer (the variable-resistance layer) over the first electrode; forming a third layer (the constant-resistance layer) over the variable-resistance layer; forming a fourth layer (the cap layer) over the constant-resistance layer; forming a fifth layer (a second electrode) over the cap layer. Forming the fourth layer may include sputtering the transition metal and the first additional element in a reactive ambient including oxygen or nitrogen. Forming the cap layer may include sputtering the transition metal and the second additional element in an inert ambient (e.g., less than 0.001% partial pressure of oxygen or nitrogen).

The forming of the constant-resistance layer may include sputtering a transition metal and a first additional element in a reactive ambient that may include oxygen or nitrogen. The forming of the cap layer may include sputtering the transition metal and a second additional element in an inert ambient that may have less than 0.001% partial pressure of oxygen or nitrogen. The first additional element and the second additional element may be identical or different.

Optionally, a vacuum break or heat-treatment of the substrate may be done between the forming of the cap layer and the forming of the second electrode. Optionally, the cap layer may be doped during or after its formation. The dopant may be selected to increase the conductivity of the cap.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

FIGS. 3A-C conceptually illustrate the effect of oxidizing the electrode-adjacent interface of a ternary oxide constant-resistance layer (CRL).

FIGS. 4A-C conceptually illustrate the effect of oxidizing a non-oxide cap layer over the ternary oxide ER.

FIG. 5 is a juxtaposition of measurements of chromium silicon oxide with varying proportions of Cr and O.

DETAILED DESCRIPTION OF EXAMPLE EMBODIMENTS

Figure 1:
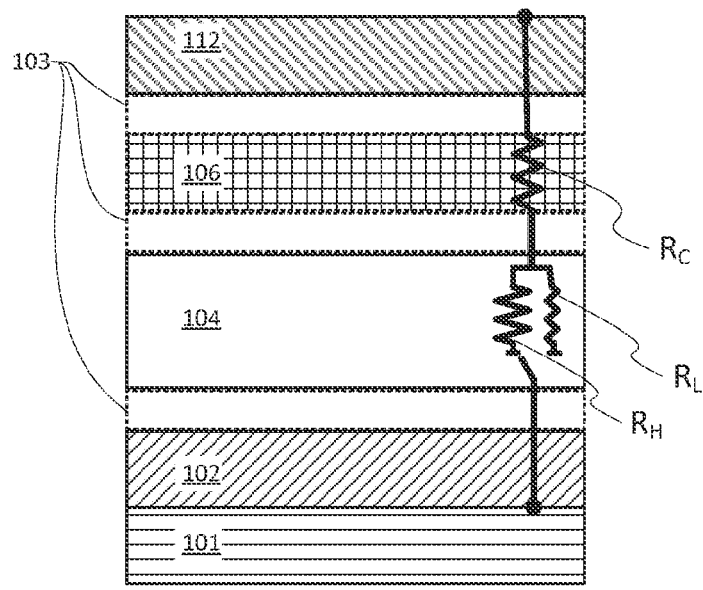
FIG. 1 is a simplified block diagram of a resistive-switching non-volatile memory cell.

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

"A," "an," and singular nouns: May include plural variations, e.g., "a layer" may mean "one or more layers."

"About" or "approximately": Within ±10% variation.

"Above" and "over": Either directly contacting or separated by intervening elements; may conform to an underlying 3D structure.

"Between" (range of values): Both boundary values and any value between the boundaries can be within the scope.

"Conductive": Resistivity <1 e-5 Ω·m at the intended operating temperature.

"Conformal": Step coverage of at least 75%.

"Constant resistance" (in a ReRAM embedded resistor layer): Resistance that remains approximately constant (e.g., ±25%) in response to either "read" or "write" signals.

"Crystalline": Exhibits at least 30% crystallinity as measured by a technique such as x-ray diffraction (XRD).

"Dopant": A minor constituent (generally <30 atomic %) intentionally added (not a residue or impurity from imperfect constituents or processes). May or may not be electrically active.

"Film" and "layer": Interchangeably describe a portion of a stack; may include multiple sub-layers (e.g., a nanolaminate).

"First," "second," and other ordinals: For differentiation only, rather than imposing any specific spatial or temporal order.

"Horizontal": In a plane parallel to the surface of a substrate. "Above," "below," "bottom," "top," "side" (e.g. sidewall), "higher," "lower," "upper," "over," and "under" are relative to the horizontal plane.

"Identical" (composition of compound): Within ±10 atomic %.

"Insulating" or "dielectric": Resistivity >1 e8 Ω·m at the intended operating temperature.

"On": Directly contacting; may conform to an underlying 3D structure.

"Operable" (for a specific purpose): Would satisfactorily fulfill that purpose given suitable connections, signals, or other external conditions.

"Or" in a list: Any, all, or any subset of list may be used.

"Oxide" (of an element): May include additional components besides the element and oxygen, including but not limited to a dopant or alloy.

"Substantially": Within up to ±5% variation.

"Substrate": A wafer or any other workpiece on which formation or treatment of material layers is desired. Non-limiting examples include silicon, germanium, silica, sapphire, zinc oxide, SiC, AlN, GaN, Spinel, silicon on oxide, silicon carbide on oxide, g "Surface": Boundary between the ambient environment and a feature of the substrate.

"Vacuum": pressure less than about 0.1 Torr.

"Variable resistance" (in a ReRAM resistive-switching layer): Resistance that is reversibly switched between at least two stable states by "write" signals, but remains approximately constant in response to "read" signals.

"Vertical": In a direction perpendicular to a nominally planar surface of the substrate.

FIG. 1 is a simplified block diagram of a resistive-switching non-volatile memory cell. Substrate 101 may include additional layers and structures beneath the memory cell. Outer electrodes 102 and 112 are conductive layers that may form contacts with the word-lines and bit-lines that select a particular cell, within an array or group of other cells, to read or write. Variable-resistance (VR) layer (or stack) 104 reversibly, repeatably switches between at least two stable states (e.g., low-resistance state $R_L$ and high-resistance state $R_H$) in response to a "write" signal of an above-threshold energy transmitted through electrodes 102 or 112. For example, "write" signals may include a "set" signal that forms a conductive filament inside VR layer 104, producing the low-resistance state, and a "reset" signal that breaks, dissipates, or otherwise destroys the filament, returning the VR layer to the high-resistance state. In other types of memory, a write signal may change the phase, morphology, magnetic dipole, or some other electrical property of the VR layer or one or more of its interfaces. The "write" signal may be purely electrical, or may alternatively include a magnetic, thermal, or optical component. However, when a "read" signal is applied to sense the state of VR layer 104, its resistance does not change, generally because the "read" signal transfers only a sub-threshold energy to the layer.

Optionally, a constant-resistance layer (or stack) 106, also known as an embedded resistor (ER) may be included in the cell to prevent excessive current from flowing through variable-resistance layer 104 or some other sensitive structure in the cell. For example, in cells that change resistive state by forming and breaking conductive filaments, excessive current in a "set" signal could potentially create a filament so wide or dense as to be unbreakable by a normal "reset" signal. This would effectively lock the cell permanently in its low-resistance state, incapable of being overwritten. To prevent this, CRL 106 acts like a non-variable resistor connected in series with the variable-resistance switch of VR layer 104, maintaining a constant resistance $R_C$ (e.g., within ±25% or less) when either "read" or "write" signals are applied to the cell.

In addition, any number of intervening layers 103 may be formed between electrodes 102 and 112. Examples of intervening layers (or stacks) include barrier layers to prevent inter-layer reactions or diffusion of metals or oxides; buffer layers; defect-access layers; doping layers; coupling layers; diodes or other current-steering components; intermediate electrodes; and others.

Figure 2:
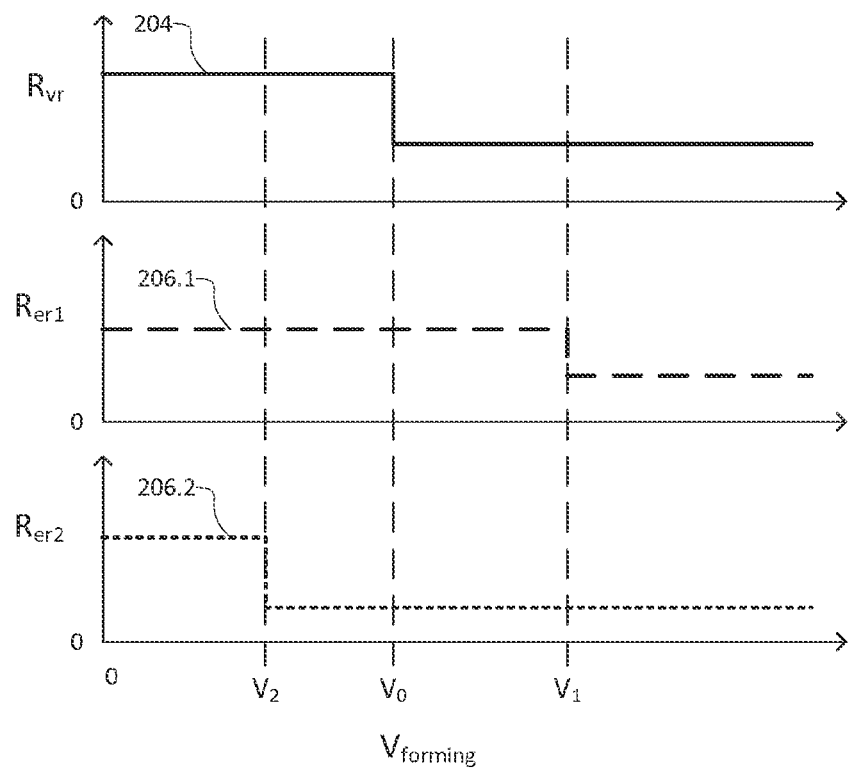
FIG. 2 is a conceptual graph demonstrating breakdown voltages of two types of CRL compared to the breakdown voltage of the VR.

FIG. 2 is a conceptual graph demonstrating breakdown voltages of two types of CRL compared to the breakdown voltage of the VR. During forming, the VR layer is subjected to electrical breakdown to form the filament. As shown by line 204, its resistance $R_{vr}$ is initially high because the VR layer begins, before the forming operation, as a dielectric with no conductive filaments. The forming voltage is increased until the VR layer breaks down at its breakdown voltage $V_0$, forming a filament that decreases its resistance. Typically, to prevent over-forming, the forming voltage is not further increased after the VR breakdown is detected.

Curve 206.1 is a similar resistance vs. voltage plot for a first type of CRL, $CRL_1$. The breakdown voltage of $CRL_1$ is $V_1$, greater than $V_0$. If the forming operation ends when the VR breakdown is detected, $V_1$ is never applied and $CRL_1$ never breaks down. Consequently, the resistance of $CRL_1$ remains high during routine reading and writing of the cell.

Curve 206.2 is a similar resistance vs. Voltage plot for a second type of CRL, $CRL_2$. The breakdown voltage of $CRL_2$ is $V_2$, less than $V_0$, so that it breaks down at a lower voltage, earlier in the forming operation than the VR layer. Consequently, the resistance of $CRL_2$ is decreased by the breakdown to a low value, which persists during routine reading and writing of the cell so that the cell with $CRL_2$ may operate at lower power than the cell with $CRL_1$. In addition, the breakdown of $CRL_2$ can be sensed during forming as an "early warning" preceding the breakdown of the VR layer. For example, after the breakdown of $CRL_2$ is detected, the power supply applying the forming voltage may be controlled to slow down the voltage ramping to reduce the risk of over-forming.

FIGS. 3A-C conceptually illustrate the effect of oxidizing the electrode-adjacent interface of a ternary oxide constant-resistance layer (CRL). In FIG. 3A, substrate 301 may include layers or structures such as an electrode, a VR layer, a current steering element, an interconnect such as a word-line or bit-line, or any other appropriate structure under illustrated CRL 306. Graphically, the downward-slanting continuous lines represent transition metal TM (e.g., Cr, Ta, W, Nb), the upward-slanting broken lines represent additional element AE (e.g., Al, B, Ni, Si or Ti), and the circles represent oxygen; these are the components of the ternary oxide CRL.

In FIG. 3B, ternary oxide CRL 306 is exposed to additional oxygen 310. As shown, this could be from the ambient during a vacuum break or subsequent process. Some of the additional oxygen is absorbed into the upper interface of CRL 306.

In FIG. 3C, electrode 312 is formed over CRL 306. Another way for additional oxygen 310 to enter the ER/electrode interface is for it to migrate from the electrode, for example during annealing. Measurements, e.g., by X-ray photoelectron spectroscopy (XPS) and Auger electron spectroscopy (AES) show significant presence of oxygen in metal and metal nitride electrodes. For example a platinum (Pt) electrode examined by AES after annealing in $O_2$ had 10-20 at % absorbed oxygen near its upper surface. The effect of the extra oxygen is to add a large contact resistance 320 at the electrode-CRL interface added to the CRL resistance 360. The top portion of the ternary oxide began with a high density of oxygen; adding even more drove up the contact resistance significantly. Because the additional oxygen is an uncontrolled factor, it causes the net resistance to vary from cell to cell. It also undesirably raises the low-field resistance that determines the power needed for operation.

Some approaches try to prevent oxygen exposure between formation of the CRL and formation of the electrode. This can inconveniently limit the variety of materials that can be used for different layers, or require an expensive multi-chamber tool with multiple chambers for different processes sharing a controlled environment that can be kept substantially free of oxygen.

FIGS. 4A-C conceptually illustrate the effect of oxidizing a non-oxide cap layer over the ternary oxide ER. In FIG. 4A, cap 416 is formed over ternary oxide CRL 406 on substrate 401, which may include structures underneath CRL 406 similarly to substrate 301. The composition of cap 416 does not include oxygen or nitrogen, but does include the same transition metal TM as the CRL (e.g., Cr, Nb, W, and Ta) and an additional element AE that may or may not be the same as the additional element in the CRL (e.g., Al, B, Ni, Si or Ti). Cap 416 is conductive, comparable to the electrodes in the cell. It does not contribute any significant resistance (e.g., less than 3% of the CRL resistance) to the stack. In some embodiments the cap may be doped (e.g., with Ti) to increase its conductivity.

In FIG. 4B cap 416 is exposed to additional oxygen 410. As shown, this could be from the ambient during a vacuum break or subsequent process. Some of the additional oxygen is absorbed into the upper interface of cap 416.

In FIG. 4C, electrode 412 is formed over CRL 406. Another way for additional oxygen 410 to enter the CRL/electrode interface is for it to migrate from the electrode, for example during annealing. However, this time the contact resistance 420 at the electrode-CRL interface added to the CRL resistance 460 is much smaller than in FIG. 3C. This is because the cap began with no more than perhaps small trace amounts of oxygen (e.g., the at % O at the cap interface may be less than 5% of the at % O in the ternary oxide CRL layer), so the addition of a little more oxygen does not have a large effect on contact resistance. The cap-electrode interface is much less sensitive to minor oxidation than a direct interface between the electrode and the ternary oxide CRL; thus, capping mitigates the effects of electrode interface oxidation.

FIG. 5 is a juxtaposition of measurements of chromium silicon oxide with varying proportions of Cr and O. The graphs are intended to show general trends only, and their correspondence may not be exact. In graphic section 510, the log of resistivity is plotted as Cr increases and O decreases (Si is kept roughly constant). The range of interest for CRLs with lower breakdown voltage than the VR layer is range 501: p~0.01-10 Ω·cm. Within this range, p is very sensitive to oxygen content. Symbols 502 represent layers >50 nm thick, symbols 504 represent layers <25 nm thick, and symbols 502 represent intermediate thicknesses. Above 1 Ω·cm the data becomes more thickness-dependent, but in range 501 thickness has less effect.

Graphic section 520 plots X-ray diffraction (XRD) curves for a Cr—Si composition annealed for different times. The sample that generated curve 507 had very little oxygen and one barely discernible peak 508 corresponding to the (210) (Miller index) crystalline form of $Cr_3Si$ and was annealed for a short time. The sample that generated curve 506 had more oxygen, a stronger (210) peak, and the very beginning of a peak 509 corresponding to the (211) (Miller index) crystalline form of $Cr_3Si$ and was annealed for a longer time. The sample that generated curve 505 had more oxygen, an even stronger (210) peak, and a distinct (211) peak and was annealed for the longest time.

Figures 6A, 6B, 6C:
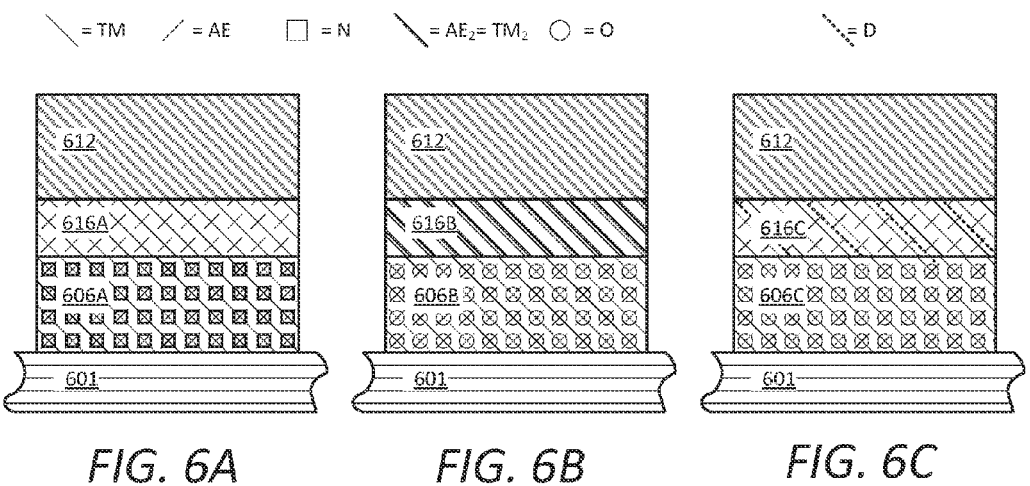
FIGS. 6A-C conceptually illustrate variations on the ternary CRL and cap.

FIGS. 6A-C conceptually illustrate variations on the ternary CRL and cap. In FIG. 6A, CRL 606A is a ternary nitride of a transition metal and an additional element, and cap 616A is a compound of the same transition metal and either the same additional element or a different additional element without intentionally added nitrogen or oxygen.

In FIG. 6B, CRL 606B is a ternary oxide (may alternatively be a ternary nitride) of a transition metal and an additional element, and cap 616B is an alloy or other compound of the same transition metal and a different additional element that is also a transition metal (e.g., Ni or Ti). The compound does not have intentionally added nitrogen or oxygen.

In FIG. 6C, CRL 606C is a ternary oxide (may alternatively be a ternary nitride) of a transition metal and an additional element, and cap 616C is a doped compound of the same transition metal and either the same additional element or a different additional element without intentionally added nitrogen or oxygen. The dopant may be a conductive dopant, e.g., Ti.

Figure 7:
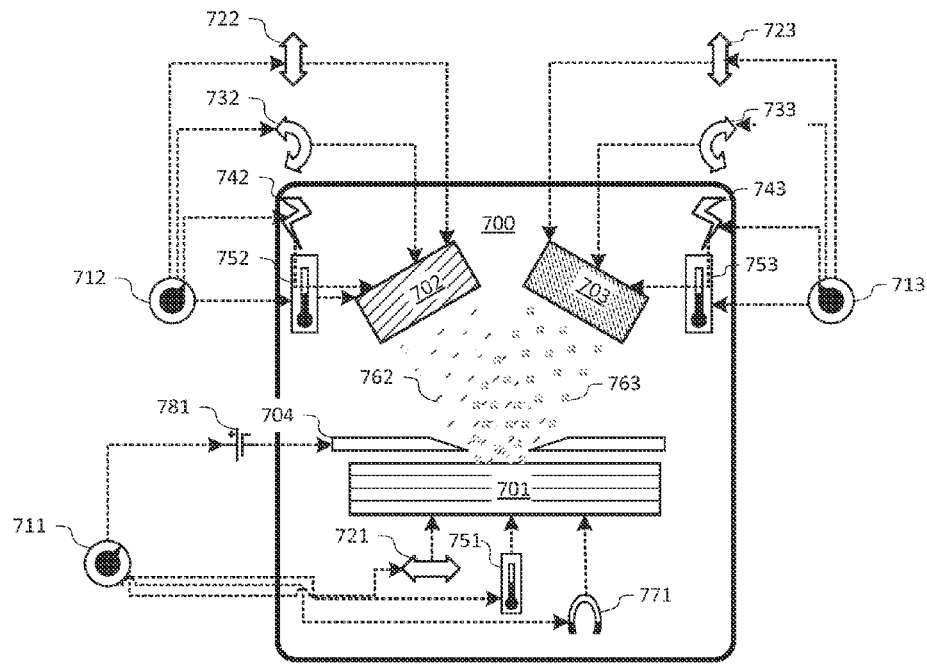
FIG. 7 is a block diagram of co-sputtering in an example PVD chamber.

FIG. 7 is a block diagram of co-sputtering in an example PVD chamber. In chamber 700, substrate 701 receives a first sputtered material 762 from a first target 702 and a second sputtered material 763 from a second target 703. A controller 712 may control one or more of position 722, angle 732, plasma power 742, and temperature 752 of target 702. A controller 713 may control one or more of position 723, angle 733, plasma power 743, and temperature 753 of target 703. Although the illustrated system shows two targets for simplicity, some embodiments may use more than two targets.

Controllers 712 and 713 for the separate targets may independently vary the respective targets' position, angle, plasma power, or temperature in real time as sputtering continues. Thus the separate targets can be sputtered at different plasma power levels or temperatures, or from different throw distances to the substrate, to vary the relative concentrations of each target material being deposited on the substrate. If at least one of the variables can be changed while sputtering continues, the composition of the film may be varied with depth if desired.

Some process chambers also have a controller 711 to vary the position 721, temperature 751, and local magnetic field 771 of substrate 701. Like the other controllers 712 and 713, controller 711 may be programmable, may be remote from the process chamber and operate via a wireless connection, and may be capable of varying the substrate's position, angle, plasma power, or temperature in real time as sputtering continues. "Position" in this block diagram is symbolized by a single two-headed arrow for simplicity, but it is intended to symbolize position variation in any or all directions. Some process chambers also have a mask 704 to block sputtered materials 762, 763 from reaching selected parts of substrate 701. Optionally, a controllable bias voltage 781 may be applied to mask 704. In process chambers equipped to change the relative position of substrate 701 and mask 704 during processing, different parts of substrate 701 may be sputtered with material having different proportions of first material 762 and second material 763.

By operating shutters to block or unblock one or more targets, deposition of separate components of the layer may be initiated or terminated. By changing the power, throw-distance or angle of one or more of the targets, the ratio of one target material to the other in the deposited layer can be changed. By changing the ambient gas, the sputtering can be changed from non-reactive (forming a layer of one of more target materials) to reactive (forming a layer of oxide or nitride of one or more target materials) and vice versa.

For example, a ternary oxide can be sputtered by co-sputtering the transition metal and the additional element in an ambient that contains oxygen. Then, the oxygen may be exhausted from the chamber and a cap layer may be sputtered in an inert ambient (e.g., Ar or another noble gas). The cap may be co-sputter from the same targets as the ternary oxide, or different targets. Optionally, a cap dopant may be co-sputtered form an additional target or incorporated into one of the different targets used only for the cap.

Figure 8:
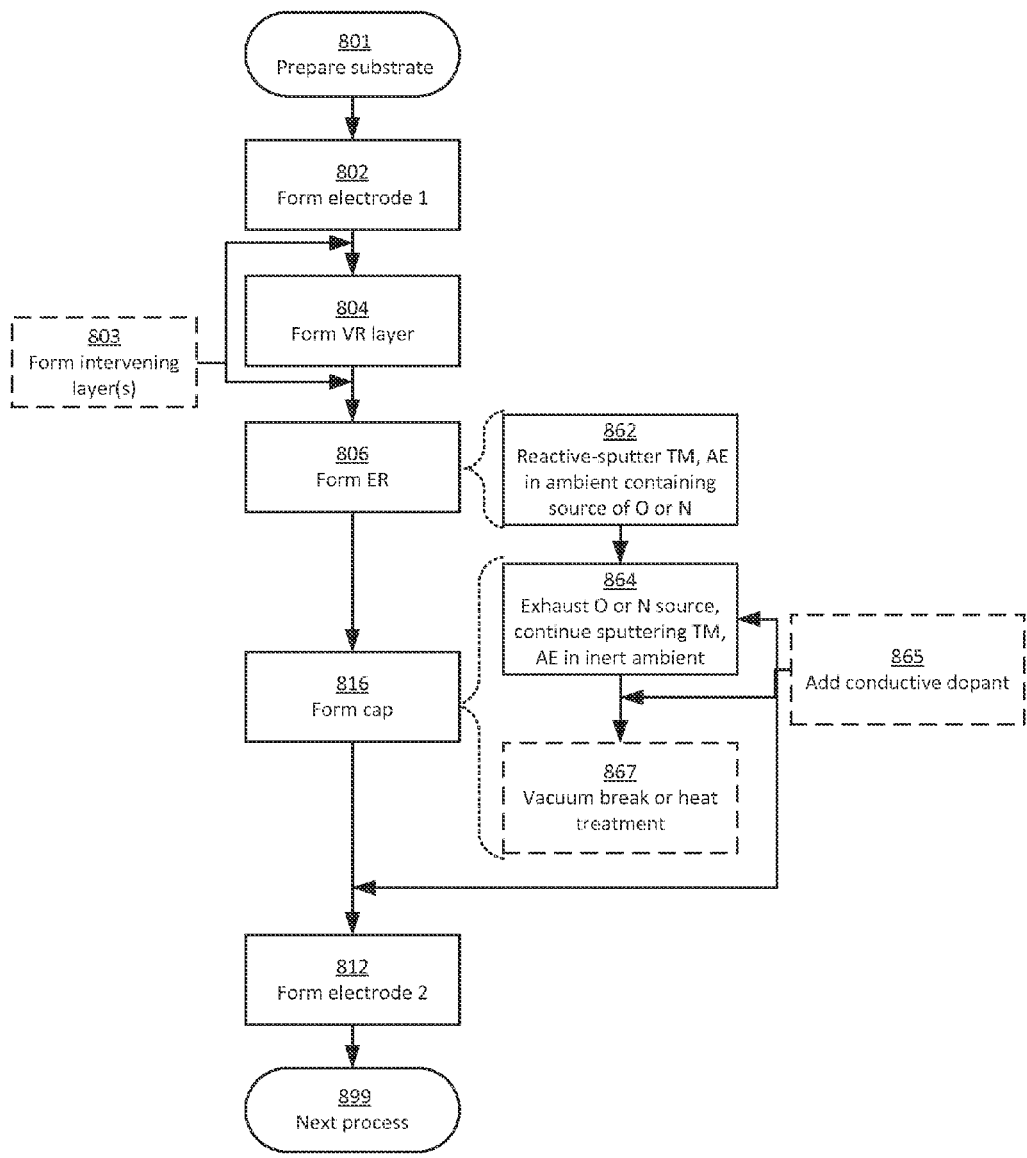
FIG. 8 is a flowchart of an example process for fabricating a ReRAM cell with a capped CRL.

FIG. 8 is a flowchart of an example process for fabricating a ReRAM cell with a capped CRL. Step 801 of preparing the substrate may include cleaning, degassing, other treatments, or the formation of layers and structures that precede those formed by this process. Step 802 of forming a first electrode over a substrate may include any suitable method for the selected material, which in some embodiments may include without limitation PVD, CVD, ALD, plasma-enhanced CVD or ALD, electrochemical deposition, or electroless deposition. Step 804 of forming a variable-resistance layer may include any suitable method for the selected material, which in some embodiments may include without limitation PVD, CVD, ALD, plasma-enhanced CVD or ALD, epitaxy, or thermal oxidation.

Step 806 of forming the constant-resistance layer may include step 862 of sputtering the transition metal and the first additional element in a reactive ambient including a source of oxygen or nitrogen (e.g., $O_2$, $H_2O$, $N_2$, and $NH_3$). Step 816 of forming a cap layer over the constant-resistance layer may include step 864 of sputtering the transition metal and the second additional element in an inert ambient (e.g., Ar or another noble gas) with less than 0.001% partial pressure of oxygen or nitrogen. The first additional element and the second additional element may or may not be identical.

Optionally, step 816 of forming a cap layer over the constant-resistance layer may also include step 865 of doping the cap layer during or after the sputtering of the transition metal and the second additional element, e.g., by co-sputtering or switching the transition metal target or the second additional element target to one that includes the dopant. Another option is to dope the cap layer after its formation 816 (e.g., by ion implantation or by forming an overlayer of dopant and thermally interdiffusing the overlayer and cap; the thermal interdiffusion may be done immediately or after depositing one or more other layers such as the second electrode).

Once cap formation 816 is complete, the substrate may optionally be subjected to step 867 of a vacuum break, heat treatment, or other exposure to a source of oxygen. Only the cap, rather than the underlying CRL, will be oxidized by the exposure. Step 812 of forming a second electrode may include the same method used for the first electrode, or any other suitable method for the selected material as described for forming the first electrode. Afterward, next step 899 may commence.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A device, comprising:
   a substrate;
   a first layer formed over the substrate, the first layer operable as a first electrode;
   a second layer formed over the first layer, the second layer operable as a second electrode;
   a third layer formed between the first layer and the second layer, the third layer operable as a variable-resistance layer;
   a fourth layer formed between the first layer and the second layer, the fourth layer operable as a constant-resistance layer; and
   a fifth layer formed in contact with the fourth layer and one of the first layer or the second layer, the fifth layer operable as a cap layer;
   wherein the fourth layer comprises a first transition metal, a first additional element, and one of oxygen or nitrogen;
   wherein the fifth layer comprises the first transition metal and a second additional element; and
   wherein an atomic percentage (at %) oxygen at an interface between the fifth layer and the fourth layer is less than 5% of an atomic percentage (at %) oxygen in the fourth layer.

2. The device of claim 1, wherein a breakdown voltage of the fourth layer is less than a breakdown voltage of the third layer.

3. The device of claim 2, wherein the breakdown voltage of the fourth layer is less than 3V.

4. The device of claim 1, wherein a resistance of the fourth layer before a forming operation is 0.1-1.2 MΩ; and wherein a device dimension of the fourth layer is 10-50 nm.

5. The device of claim 1, wherein a resistance of the fourth layer after a forming operation is 1-10 KΩ; and wherein a device dimension of the fourth layer is 10-50 nm.

6. The device of claim 1, wherein a resistivity of the fourth layer is 0.01-1 Ω·cm.

7. The device of claim 1, wherein an X-ray diffraction spectrum of the fourth layer comprises at least two crystalline peaks.

8. The device of claim 1, wherein the first transition metal comprises at least one of Cr, Ta, W, or Nb.

9. The device of claim 1, wherein the first additional element comprises Al, B, Ni, Si or Ti.

10. The device of claim 1, wherein the second additional element and the first additional element are identical.

11. The device of claim 1, wherein the second additional element and the first additional element are different.

12. The device of claim 1, wherein the second additional element is a second transition metal.

13. The device of claim 1, wherein the second additional element is Al, B, Ni, Si or Ti.

14. The device of claim 1, wherein the fifth layer further comprises a dopant.

* * * * *